United States Patent
Brown et al.

(10) Patent No.: US 6,864,041 B2
(45) Date of Patent: Mar. 8, 2005

(54) GATE LINEWIDTH TAILORING AND CRITICAL DIMENSION CONTROL FOR SUB-100 NM DEVICES USING PLASMA ETCHING

(75) Inventors: Jeffrey J. Brown, Fishkill, NY (US); Sadanand Vinayak Deshpande, Fishkill, NY (US); David V. Horak, Essex Junction, VT (US); Maheswaran Surendra, Croton-on-Hudson, NY (US); Len Y. Tsou, New City, NY (US); Qingyun Yang, Hopewell Junction, NY (US); Chienfan Yu, Highland Mills, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 09/847,479

(22) Filed: May 2, 2001

(65) Prior Publication Data

US 2002/0164546 A1 Nov. 7, 2002

(51) Int. Cl.$^7$ .......................... G03F 7/36; H01L 21/461
(52) U.S. Cl. .................. 430/316; 430/30; 430/311; 430/313; 430/317; 430/329; 438/714; 438/725; 216/49; 216/59; 216/67
(58) Field of Search .............................. 430/30, 311, 313, 430/316, 317, 329, 319; 438/714, 725; 216/49, 59, 67

(56) References Cited

U.S. PATENT DOCUMENTS

| | | | | |
|---|---|---|---|---|
| 5,021,121 A | * | 6/1991 | Groechel et al. | 438/712 |
| 5,837,428 A | * | 11/1998 | Huang et al. | 430/313 |
| 5,940,719 A | * | 8/1999 | Jang et al. | 438/443 |
| 6,107,172 A | * | 8/2000 | Yang et al. | 438/585 |
| 6,233,388 B1 | * | 5/2001 | Kim et al. | 385/143 |
| 6,235,440 B1 | * | 5/2001 | Tao et al. | 430/30 |
| 6,283,131 B1 | * | 9/2001 | Chen et al. | 134/1.2 |
| 6,368,982 B1 | * | 4/2002 | Yu | 438/753 |
| 6,372,651 B1 | * | 4/2002 | Yang et al. | 438/706 |
| 6,482,726 B1 | * | 11/2002 | Aminpur et al. | 438/585 |
| 6,599,437 B2 | * | 7/2003 | Yauw et al. | 216/47 |
| 2001/0009792 A1 | * | 7/2001 | Bothra et al. | 438/302 |
| 2002/0139773 A1 | * | 10/2002 | Gabriel et al. | 216/62 |
| 2002/0142252 A1 | * | 10/2002 | Ng | 430/313 |
| 2002/0164546 A1 | * | 11/2002 | Brown et al. | 430/316 |

* cited by examiner

*Primary Examiner*—Mark F. Huff
*Assistant Examiner*—Nicole Barreca
(74) *Attorney, Agent, or Firm*—James J. Cioffi, Esq.; McGinn & Gibb, PLLC

(57) ABSTRACT

A method of fabricating an electronic chip on a wafer in which a first mask at a predetermined lower resolution is developed on the wafer and then etched under a first set of conditions for a predetermined period to achieve a mask that is below the resolution limit of current lithography. The etched mask is then used as a hard mask for etching material on a lower layer.

12 Claims, 1 Drawing Sheet

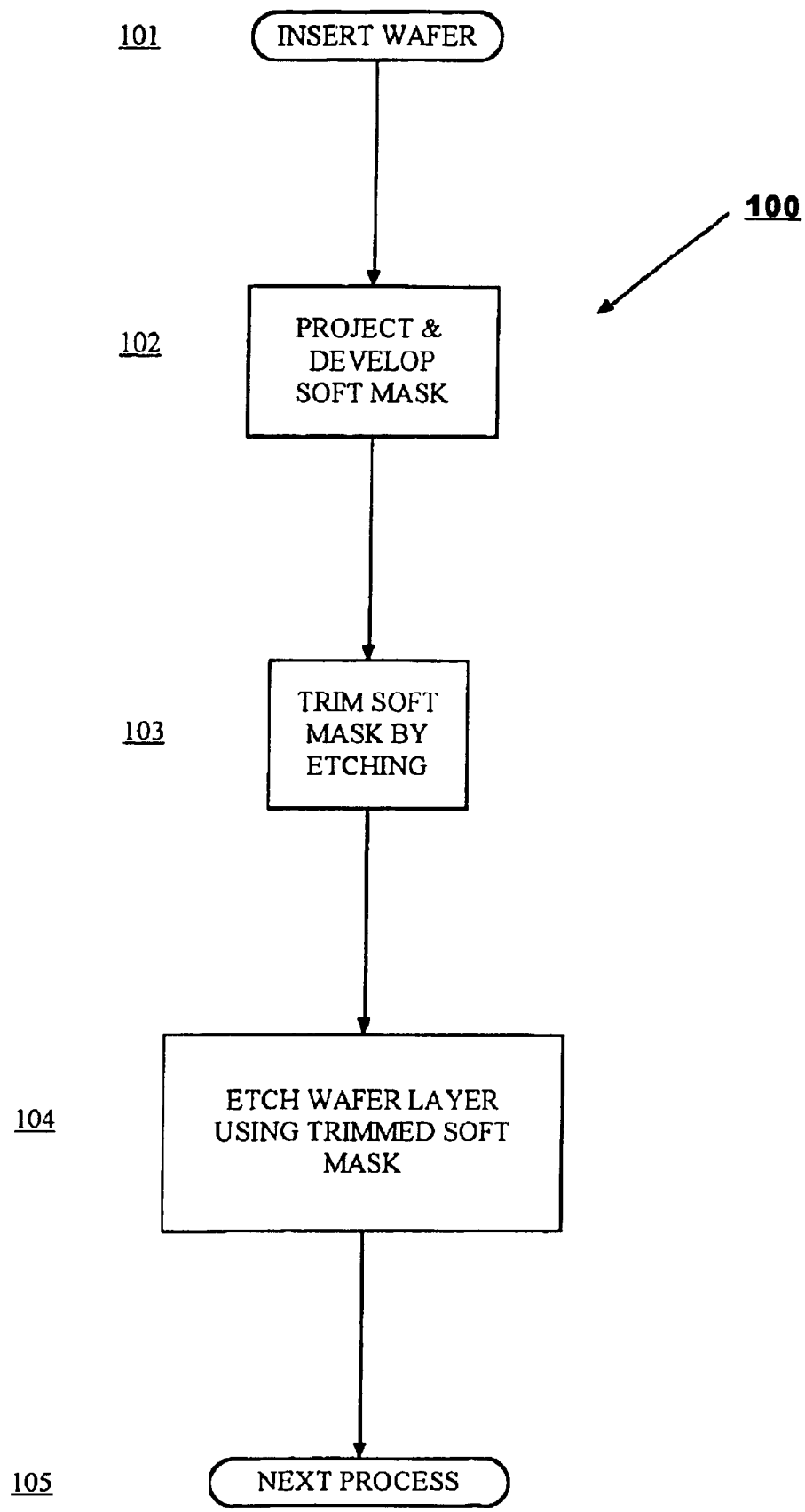

GATE LINEWIDTH TAILORING AND CRITICAL DIMENSION CONTROL FOR SUB-100 NM DEVICES USING PLASMA ETCHING

CROSS REFERENCE TO RELATED APPLICATION

The present invention is somewhat related to Application entitled "METHOD FOR POLYSILICON CONDUCTOR (PC) TRIMMING FOR SHRINKING CRITICAL DIMENSION AND ISOLATED-NESTED OFFSET CORRECTION" by Hung Yip Ng, filed Mar. 29, 2001, as U.S. patent application Ser. No. 09/821,478. The contents of this Application are incorporated by reference.

BACKGROUND OF THE INVENTION

1. Field of the Invention

The present invention generally relates to maintaining variation tolerances of line widths for electronic chip fabrication in sub-100 nm devices. Specifically, a precisely-tuned trimming plasma etch procedure for a first soft mask is followed by a precisely defined oxide hard-mask etch procedure to result in a process that achieves minimum linewidth variation tolerances from the nominal value, not only for the vertical versus horizontal dimension but also for variations between isolated features versus nested features.

2. Description of the Related Art

As features on electronic chips have become smaller, a point is eventually reached in which the conventional process of simply developing a lithographic image projected onto the wafer no longer provides the required Critical Dimension (CD). Critical dimension (or gate line-width) control has become increasingly important for Sub-100 nm devices. At these small feature sizes, not only is it critical to control variations in line widths for a single line, the fabrication must also be able to control variations considering separately the horizontal dimension versus the vertical dimension and variations considering separately the isolated features versus nested features, where nested features would mean, for example, a plurality of tightly pitched lines. Extremely tight across-chip line-width variation (ACLV) tolerances for these devices require that the isolated and nested features be identical in line-widths. In the past generations of conventional logic programs, a fixed line-width trimming process was used with no capability of altering the relative trim rate of isolated and nested features.

SUMMARY OF THE INVENTION

An object of the present invention to provide a method for achieving sub-resolution features on an electronic chip than possible using a single mask process and conventional lithography by allowing patterning of sub-lithographic (as printed) dimensions on a wafer.

It is another object of the present invention to provide a method for achieving a minimum linewidth variation across an entire electronic chip and an entire wafer.

It is another object of the present invention to provide a linewidth variation of features that are isolated that is essentially the same as the linewidth variation of features that are nested.

It is another object of the present invention to provide an implementation of the method using a conventional plasma reactor readily available in manufacturing.

It is another object of the present invention to provide a low cost implementation of the method.

It is another object of the present invention to provide a method of controlling linewidth variation with a relatively quick solution available for upcoming product generations using even higher resolutions.

It is another object of the present invention to provide a method for precise control of gate-linewidth tolerances.

It is another object of the present invention to provide a method in which the final line-width can be precisely controlled by adjusting the time in the trim step and process parameters described hereinbelow.

It is another object of the present invention to provide a method in which the choice of N2 and O2 as gases for the trim step makes it selective to the underlying oxide hard-mask. This allows for independent control of the soft-mask dimensions prior to etching of the hard-mask. This process could be extended to applications with other types of hard-mask materials such as silicon nitride.

It is another object of the present invention to provide a hard-mask etch process that allows for a vertical transfer of the "trimmed" soft-mask dimension into the oxide hard-mask, thus providing good final line-width control.

In view of the foregoing and other problems, this invention solves this problem by providing a method to achieve very tight tolerance on variation of lines by printing a first mask on a wafer, referred to as a soft mask, using conventional photolithographical techniques well known in the art. This soft mask is then trimmed using a precisely-defined set of etch conditions. This trimmed soft mask is then used to define (etch) the hard-mask, which is subsequently used to etch one or more layers on the wafer itself Conditions of this second etch are likewise very precisely-defined. The desired effect achieved in this dual masking technique is a minimum linewidth variation in isolated feature versus nested features.

As a first aspect of the invention, to accomplish these objectives, there is disclosed a method of fabricating an electronic chip on a wafer, including developing on the wafer a first mask at a predetermined lower resolution and etching the first mask under a first set of conditions for a predetermined period to achieve a higher resolution mask.

As a second aspect of the invention, there is disclosed a method of fabricating at least one electronic device or circuit on a wafer, including developing a first mask on the top surface of the wafer or of a layer of material deposited on the top surface to define a pattern for at least part of a structure or circuit component for the electronic device or circuit and where the first mask is an organic photo-sensitive resist material, performing a trimming process on the first mask to adjust dimensions of the pattern, and using the trimmed first mask as a mask for an etching process to remove material off at least one lower layer.

As a third aspect of the invention, there is disclosed a method of controlling line width variation tolerances during fabrication of electronic devices or circuits on a wafer, including developing a first mask on an outer surface of the wafer or of a layer of material deposited on the surface to define a pattern for at least part of a structure or circuit component for the electronic device or circuit where the first mask is an organic photo-sensitive resist material, performing a trimming process on the first mask to adjust dimensions of features of the first mask, and using the trimmed first mask as a mask for an etching process to remove material off at least one layer below the hard mask.

As a fourth aspect of the invention, there is disclosed a method, during fabrication of electronic devices or circuits on a wafer, where the devices or circuits have both isolated features and nested features, of controlling line width variation tolerances of the isolated features relative to the nested features while independently achieving a target critical dimension, including establishing a first set of conditions for an RF etch process that achieves the target critical dimension and controlling the RF power level as a parameter to independently control said line width variation tolerance of said isolated features relative to said nested features.

BRIEF DESCRIPTION OF THE DRAWINGS

The foregoing and other objects, aspects and advantages will be better understood from the following detailed description of a preferred embodiment of the invention with reference to the drawing in which is shown a schematic diagram teaching the basic technique of the invention.

DETAILED DESCRIPTION OF A PREFERRED EMBODIMENT OF THE INVENTION

Referring now to the drawing, a basic technique is discussed in which a first mask, referred to as a soft mask, is developed on a wafer and then trimmed using a precisely tuned etching process to etch the developed masking material. The resultant trimmed mask is then used as a mask to etch a layer on the wafer, again using a precisely tuned etching process different from the previous etch by reason of having now to etch a material on the wafer rather than the mask material.

Not only is the dual etching process novel but the disclosure additionally provides a range of conditions that optimize each of the two etching steps. The inventors have developed and investigated this technique in a standard capacitively coupled plasma reactor. However, the basic technique can easily be expanded into other etching techniques, conditions, and combinations than the precise conditions described herein.

Referring now to the FIGURE, a wafer is introduced (step 101) into the environment appropriate to project and develop the first mask by lithography. Details of this projection and development step (step 102) are not so important, since various combinations are well known. More important is the recognition that a standard mask alone fails to provide the resolution and linewidth control required for small feature technologies such as required for "Sub 100 nm".

In the process used by the inventors, this first mask was developed (step 102) by deep-UV (248 nm) lithography. This involves coating the wafer with an anti-reflective coating followed by a resist material. The resist material is then exposed using deep-UV light source with a specific pattern. The exposed material is then removed by a solvent and the un-exposed area serves as the soft-mask. Typically, the soft mask is an organic material.

As is well known in the art, in order to successfully fabricate an electronic chip at any specific resolution, a nominal linewidth cannot vary outside tolerance specific to that resolution. Linewidth control is particularly critical in features such as gate lines, in which many lines are closely packed. The inventors have realized that this soft mask developed on the wafer fails to provide the linewidth control required for higher resolution technology such as Sub 100 nm. They have realized that the original mask, referred to as the soft mask, can be developed on the wafer at an easily controlled lower resolution and then subsequently trimmed to achieve a smaller line width, otherwise not achieved by conventional lithography.

In the case of Sub-100 nm, the soft mask might be developed having nominal line widths at, for example, 120 nm or 100 nm. The first etching process is a trimming process designed to etch these soft mask lines down from initial nominal values to a smaller target nominal value in the sub-100 nm range, for example, 75 nm. However, since the trimmed soft mask provides the foundation for the subsequent hard layer etch, it is critical that line width tolerance be precisely controlled for the trimming etch step. This is particularly important in the control of the isolated features versus the nested features. Precise conditions would depend upon the specific soft mask material and preferred etching technique. One preferred embodiment for this first (soft mask) etch has the following conditions:

1. Oxygen $O_2$ and nitrogen $N_2$ is used for a plasma process to trim the resist image as-printed to the target critical dimension (CD);

2. The flow ratio of oxygen to nitrogen is between 0.25 and 2.5;

3. The RF power is set at a nominal value, depending on the mask material used, but the inventors have found the range of 50 to 200 watts as being effective.

4. The process chamber pressure between 10 and 45 mTorr.

These ranges set the conditions for the plasma etch of the soft mask. The precise time for etching depends only on determining the etch rate for the specific mask material and the specific values set from the ranges above. This etch rate is easily determined by one skilled in the art. Having measured this etch rate, the soft mask is then etched under those specific conditions for the length of time required to etch the soft mask lines from the as-printed dimension down to the target critical dimension, and this time is easily calculated since the as-printed dimension is known, as is the target critical dimension and the etch rate. For example, having measured the etch rate for the specific set conditions of the etch, it is a straightforward calculation to determine the exact etch time to reduce the pattern deposited at 120 nm down to a target critical dimension of 75 nm.

A second key aspect of the invention is the etching of at least one layer on the wafer using the trimmed soft mask as a mask for the second etch process. The target layer of this second etch would typically be an inorganic layer deposited on the surface of the wafer, such as a gate oxide layer. However, the basic concept of the invention is not limited to gates and would be easily extended to other types of layers and features.

Since the targetted feature of a preferred embodiment of the invention is that of gate line width control, the second etch involves an opening up of the oxide layer used as the hard-mask, so the hard mask is the starting point for patterning the gate material underneath.

Since the hard layer differs in composition from the soft mask material, a different etch is needed. However, similar to the first etch process, it is critical to precisely control this second etch in order to achieve tight line width tolerances, especially to achieve tolerances for isolated features relative to nested features. For the oxide layer etch, the process parameter space defined above for the soft mask trimming etch is followed with a $CF_4/CHF_3$/Argon based hard-mask process that provides a vertical side-wall. This is key to achieving the tight line-width tolerences. The flow rates found most effective for the hard-mask etch are as follows: 20–80 sccm (standard Cubic Centimeters/Minute) for $CF_4$; 5–15 sccm for $CHF_3$; and 40–200 sccm for argon.

Also similar to the first etch, the second etch can easily be measured for etch rate using specific settings in these ranges and precise etch times determined once the thickness and material of the target layer is known. It is also easy to recognize that, similar to the soft mask trimming etch which primarily addressed the control of the width dimension of lines, the hard layer etch could likewise be designed to reduce the width of lines in a controlled etch rate in addition to achieving a vertical side-wall. Therefore, the second etch becomes another possible method to further reduce resolution relative to the initial lithographic resolution.

The effect of RF power is particularly important to the technique because the isolated and nested features can to tuned independent of target CD. Increasing the RF power impacts the isolated features more than the nested features, while the target CD depends mainly on the length of time of this process step. On a relative scale, the use of a higher RF power increases the amount of reactant species (namely, oxygen radicals) to the isolated feature more compared to the nested features. Therefore, the RF power serves as a tuning knob for isolated to nested line-width tolerances independent of the final critical dimension achieved.

The invention as describe above has a number of benefits. One of the most important benefit of this invention is that it allows patterning of sub-lithographic (as printed) dimensions on the wafer. By doing so, it provides the precise control of gate-linewidth tolerances. The final line-width can be precisely controlled by adjusting the time in the trim step and process parameters described above.

The choice of $N_2$ and $O_2$ as gases for the trim step makes it selective to the underlying oxide hard-mask. This allows for independent control of the soft-mask dimensions prior to etching of the hard-mask. The process of the invention could be extended to applications with other types of hard-mask materials such as silicon nitride, thereby providing higher resolution and line width control for circuit and device features other than gate line width.

Finally, the hard-mask etch process described in this invention allows for a vertical transfer of the "trimmed" soft-mask dimension into the oxide hard-mask, thus providing good final line-width control.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of fabricating an electronic chip on a wafer, comprising:
   developing on a surface of said wafer a first mask at a predetermined lower resolution; and
   etching said first mask under a first set of conditions for a predetermined period to achieve a higher resolution mask, said higher resolution achieving a critical dimension that is below 100 nm, said first set of conditions including a tuning parameter to independently control a line width variation tolerance of isolated features relative to nested features,
   wherein said critical dimension is between 75 nm and 100 nm.

2. The method of claim 1, wherein said first mask comprises on organic photo-sensitive resist material.

3. The method of claim 1, wherein said first set of conditions comprises an oxygen and nitrogen plasma etch, wherein
   a flow ratio of oxygen to nitrogen is between 0.25 and 2.5;
   a setting of an RF power is in the range of 50 to 200 watts; and
   a setting of a pressure is between 10 and 45 mTorr.

4. The method of claim 1, further comprising:
   etching, under a second set of conditions for a second predetermined period, at least one layer of said wafer or at least one layer of material deposited on said wafer under said first mask, to remove at least a portion of said at least one layer to produce features at said higher resolution.

5. The method of claim 4, wherein said second set of conditions comprises a $CF_4/CHF_3$/Argon based hard-mask process for etching a gate oxide layer.

6. The method of claim 5, wherein said second set of conditions further comprises a range of 20–80 sccm (standard Cubic Centimeters/Minute) for $CF_4$, 5–15 sccm for $CHF_3$, and 40–200 sccm for argon.

7. A method of fabricating at least one electronic device or circuit on a wafer, comprising:
   developing a first mask on an outer surface of said wafer or of a layer of material deposited on said surface to define a pattern for at least part of a structure or circuit component for said electronic device or circuit, said first mask comprising an organic photo-sensitive resist material;
   performing a trimming process on said first mask to adjust dimensions of said pattern, said trimming process achieving a critical dimension that is less than 100 nm; and
   using said trimmed first mask as a hard mask for an etching process to remove material from at least one layer below said hard mask, wherein
   said trimming process includes a tuning parameter to independently control a line width variation tolerance of isolated fractures relative to nested features,
   wherein said critical dimension is between 75 nm and 100 nm.

8. The method of claim 7, wherein said trimming process of said first mask comprises an oxygen and nitrogen plasma etch, wherein
   a flow ratio of oxygen to nitrogen is between 0.25 and 2.5;
   a setting of an RF power is in the range of 50 to 200 watts, and
   a setting of a pressure is between 10 and 45 mTorr.

9. The method of claim 7, wherein said etching process to remove material from said at least one layer below said hard mask comprises a $CF_4/CHF_3$/Argon based hard-mask process for etching a gate oxide layer.

10. The method of claim 9, wherein conditions of said etching to remove material off at least one layer below said hard mask comprises a range of 20–80 sccm (standard Cubic Centimeters/Minute) for $CF_4$, 5–15 sccm for $CHF_3$, and 40–200 sccm for argon.

11. A method of controlling line width variation tolerances during fabrication of electronic devices or circuits on a wafer, comprising:
   developing a first mask on an outer surface of said wafer or of a layer of material deposited on said surface to define a pattern for at least part of a structure or circuit component for said electronic device or circuit, said first mask comprising an organic photo-sensitive resist material;
   performing a trimming process on said first mask to adjust dimensions of features of said first mask, said trimmed process achieving a critical dimension that is less than 100 nm; and
   using said trimmed first mask as a hard mask for an etching process to remove material from at least one layer below said hard mask, wherein said trimming process of said first mask comprises an oxygen and nitrogen plasma etch, in which;
  a flow ratio of oxygen to nitrogen is between 0.25 and 2.5;
  a setting of an RF power is in the range of 50 to 200 watts; and
  a setting of a pressure is between 10 and 45 mTorr, and
said critical dimension is between 75 nm and 100 nm.

12. A method, during fabrication of electronic devices or circuits on a wafer, said devices or circuits having both isolated features and nested features, of controlling line width variation tolerances of said isolated features relative to said nested features while independently achieving a target critical dimension that is less than 100 nm, comprising:
  establishing a first set of conditions for an RF etch process that achieves said target critical dimension; and
  controlling a level of said RF power as a parameter to independently control said line width variation tolerance of said isolated features relative to said nested features,
wherein said first set of conditions comprises an oxygen and nitrogen plasma etch, in which:
  a flow ratio of oxygen to nitrogen is between 0.25 and 2.5;
  a setting of an RF power is in the range of 50 to 200 watts, and
  a setting of a pressure is between 10 and 45 mTorr, and
said critical dimension is between 75 nm and 100 nm.

* * * * *